United States Patent
Huang et al.

(10) Patent No.: US 8,698,534 B1
(45) Date of Patent: Apr. 15, 2014

(54) DIGITAL-TO-ANALOG CONVERSION APPARATUS AND CURRENT-MODE INTERPOLATION BUFFER THEREOF

(71) Applicant: Himax Technologies Limited, Tainan (TW)

(72) Inventors: Hung-Yu Huang, Tainan (TW); Jia-Hui Wang, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/738,696

(22) Filed: Jan. 10, 2013

(51) Int. Cl.
*H03H 11/16* (2006.01)
*H03K 5/13* (2006.01)

(52) U.S. Cl.
USPC ........... 327/256; 327/231; 327/237; 327/238; 327/103; 327/70

(58) Field of Classification Search
USPC ................ 327/70, 103, 231, 237, 238, 256
See application file for complete search history.

(56) References Cited

U.S. PATENT DOCUMENTS

| | | | | |
|---|---|---|---|---|
| 6,535,562 B1 * | 3/2003 | Mohseni et al. | | 375/296 |
| 6,806,744 B1 * | 10/2004 | Bell et al. | | 327/70 |
| 6,806,763 B2 * | 10/2004 | Kim et al. | | 327/541 |
| 6,819,276 B1 * | 11/2004 | Hossack | | 341/143 |
| 7,010,280 B1 * | 3/2006 | Wilson | | 455/126 |
| 7,162,002 B2 * | 1/2007 | Chen et al. | | 375/376 |
| 7,541,844 B2 | 6/2009 | Chiu et al. | | |
| 7,560,967 B2 * | 7/2009 | Freyman et al. | | 327/231 |
| 7,961,025 B2 * | 6/2011 | Rylov | | 327/231 |

\* cited by examiner

*Primary Examiner* — Lam T Mai
(74) *Attorney, Agent, or Firm* — J.C. Patents

(57) ABSTRACT

A digital-to-analog conversion apparatus and a current-mode interpolation buffer thereof are provided. The current-mode interpolation buffer comprises a current source, a first differential transistor pair, a second differential transistor pair and an output stage. The current source outputs a first current and draws a second current. Wherein, the amperages of the first current and the second current are dependent on a digital code. First differential transistor pair generates a first differential current according a first rough voltage, an analog voltage and the first current. Second differential transistor pair generates a second differential current according a second rough voltage, the analog voltage and the second current. Output stage generates the analog voltage according to the first differential current and the second differential current, where the analog voltage belongs to a rough range from the first rough voltage to the second rough voltage.

18 Claims, 8 Drawing Sheets

DIGITAL-TO-ANALOG CONVERSION APPARATUS AND CURRENT-MODE INTERPOLATION BUFFER THEREOF

BACKGROUND OF THE INVENTION

1. Field of the Invention

The invention relates to a buffer. Particularly, the invention relates to a rail-to-rail current-mode interpolation buffer.

2. Description of Related Art

As a size and a resolution of a liquid crystal panel increase, a layout area of a display driving chip becomes larger. Therefore, it becomes an important issue to reduce the chip area and production cost.

Generally, a display capable of converting an image signal of N-bit resolution into an analog voltage may include $2^N$ reference voltage traces to provide $2^N$ gamma reference voltages, and a digital-to-analog converter therein switches to output one of the $2^N$ gamma reference voltages to a voltage buffer according to the image signal.

However, as the resolution increases, the number of the reference voltage traces becomes larger, which lead to a considerable chip layout area.

SUMMARY OF THE INVENTION

The invention is directed to a current-mode interpolation buffer, which is capable of providing an interpolation voltage within a rough range from a first rough voltage to a second rough voltage according to a digital code.

The invention is directed to a digital-to-analog conversion apparatus, which uses a current-mode interpolation buffer to reduce the number of bits of a digital-to-analog converter (DAC), so as to reduce a chip area of the DAC.

The invention provides a current-mode interpolation buffer for receiving a first rough voltage, a second rough voltage and at least one bit of a digital code, and outputting an analog voltage. The current-mode interpolation buffer comprises a current source, a first differential transistor pair, a second differential transistor pair and an output stage. The current source receives the at least one bit of the digital code, and outputs a first current and draws a second current, where amperages of the first current and the second current are dependent on the at least one bit. A first control terminal and a second control terminal of the first differential transistor pair respectively receive the first rough voltage and the analog voltage. A reference terminal of the first differential transistor pair is coupled to the current source for receiving the first current. A current terminal pair of the first differential transistor pair generates a first differential current. A first control terminal and a second control terminal of the second differential transistor pair respectively receive the second rough voltage and the analog voltage. A reference terminal of the second differential transistor pair is coupled to the current source for draining the second current. A current terminal pair of the second differential transistor pair generates a second differential current. A first input terminal pair and a second input terminal pair of the output stage are respectively coupled to the current terminal pair of the first differential transistor pair and the current terminal pair of the second differential transistor pair, and generates the analog voltage according to the first differential current and the second differential current, where the analog voltage belongs to a rough range from the first rough voltage to the second rough voltage.

The invention provides a digital-to-analog conversion apparatus for converting a digital code into an analog voltage. The digital-to-analog conversion apparatus includes a digital-to-analog converter and a current-mode interpolation buffer. The current-mode interpolation buffer comprises a current source, a first differential transistor pair, a second differential transistor pair and an output stage. The digital-to-analog converter receives a first partial-bit of the digital code, and outputs a first rough voltage and a second rough voltage having corresponding levels according to the first partial-bit. The current-mode interpolation buffer is coupled to the digital-to-analog converter. The current source receives a second partial-bit of the digital code, and outputs a first current and draws a second current, where amperages of the first current and the second current are dependent on the second partial-bit of the digital code. A first control terminal and a second control terminal of the first differential transistor pair respectively receive the first rough voltage and the analog voltage, a reference terminal thereof is coupled to the current source for receiving the first current, and a current terminal pair thereof generates a first differential current. A first control terminal and a second control terminal of the second differential transistor pair respectively receive the second rough voltage and the analog voltage, a reference terminal thereof is coupled to the current source for draining the second current, and a current terminal pair thereof generates a second differential current. A first input terminal pair and a second input terminal pair of the output stage are respectively coupled to the current terminal pair of the first differential transistor pair and the current terminal pair of the second differential transistor pair, and generates the analog voltage according to the first differential current and the second differential current, where the analog voltage belongs to a rough range from the first rough voltage to the second rough voltage.

According to the above descriptions, the current-mode interpolation buffer of the invention can provide the interpolation voltage according to a partial-bit of the digital code, so as to provide a rail-to-rail interpolation voltage range from the first rough voltage to the second rough voltage. The invention further provides the digital-to-analog conversion apparatus, which uses the current-mode interpolation buffer to reduce the number of bits of the digital-to-analog converter. The digital-to-analog converter outputs the first and the second rough voltages having the corresponding levels according to the first partial-bit of the digital code. The current-mode interpolation buffer provides the interpolation voltage within the rough range from the first rough voltage to the second rough voltage according to the second partial-bit of the digital code. Therefore, the digital-to-analog conversion apparatus of the invention can reduce a chip area of the digital-to-analog converter.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
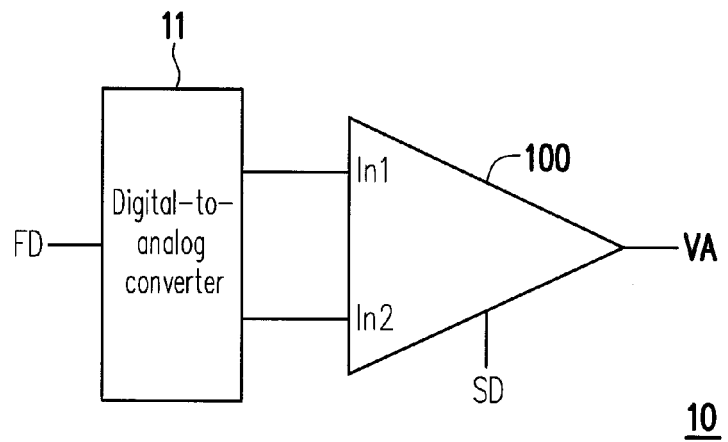
FIG. 1 is a schematic diagram of a digital-to-analog conversion apparatus according to an embodiment of the invention.

FIG. 1 is a schematic diagram of a digital-to-analog conversion apparatus according to an embodiment of the invention. The digital-to-analog conversion apparatus 10 of FIG. 1 includes a digital-to-analog converter (DAC) 11 and a current-mode interpolation buffer 100. The current-mode interpolation buffer 100 is coupled to the DAC 11. The DAC 11 receives a first partial-bit FD of a digital code, and switches to output two adjacent rough voltages having corresponding levels in a plurality of reference voltages to the current-mode interpolation buffer 100 according to the first partial-bit FD of the digital code. For example, assuming the DAC 11 is a 3-bit converter, when the first partial-bit FD of the digital code is "001", the DAC 11 outputs a $0^{th}$ gray-level voltage (a rough voltage) V_0 and a first gray-level voltage V_1 (or the first gray-level voltage V_1 and a second gray-level voltage V_2) to input terminals In1 and In2 of the current-mode interpolation buffer 100. When the first partial-bit FD of the digital code is "100", the DAC 11 outputs a third gray-level voltage V_3 and a fourth gray-level voltage V_4 (or the fourth gray-level voltage V_4 and a fifth gray-level voltage V_5) to input terminals In1 and In2 of the current-mode interpolation buffer 100.

The current-mode interpolation buffer 100 receives a second partial-bit SD of the digital code, and the input terminals In1 and In2 of the current-mode interpolation buffer 100 receive two rough voltages output by the DAC 11. According to the second partial-bit SD of the digital code, the current-mode interpolation buffer 100 interpolates the two rough voltages to obtain an analog voltage VA of a required voltage level.

Figure 2:
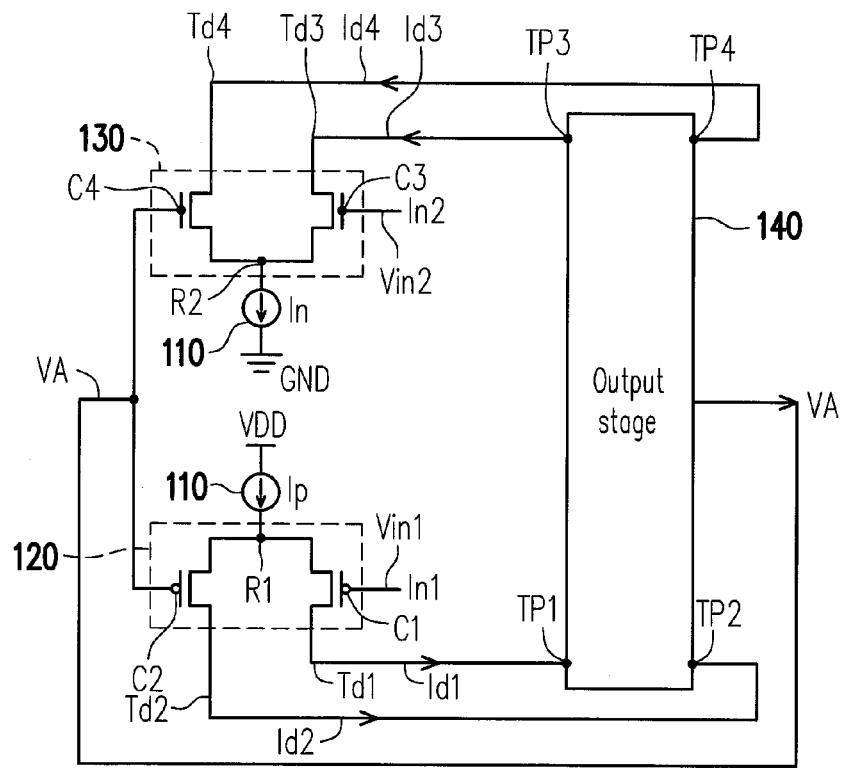
FIG. 2 is a circuit schematic diagram of the current-mode interpolation buffer of FIG. 1 according to an embodiment of the invention.

FIG. 2 is a circuit schematic diagram of the current-mode interpolation buffer 100 of FIG. 1 according to an embodiment of the invention. The current-mode interpolation buffer 100 includes a current source 110, a differential transistor pair 120, a differential transistor pair 130 and an output stage 140. The current source 110 receives at least one bit of the digital code (for example, the second partial-bit SD of the digital code of FIG. 1), and outputs a current Ip and draws a current In. In the present embodiment, amperages of the current Ip and the current In are dependent on the second partial-bit SD of the digital code. A control terminal C1 of the differential transistor pair 120 is coupled to the input terminal In1 of the current-mode interpolation buffer 100 for receiving a rough voltage Vin1. A control terminal C2 of the differential transistor pair 120 is coupled to the output terminal of the current-mode interpolation buffer 100 for receiving the analog voltage VA. A reference terminal R1 of the differential transistor pair 120 is coupled to the current source 110 for receiving the current Ip. A current terminal pair Td1 and Td2 of the differential transistor pair 120 generates a differential current Id1 and Id2. A control terminal C3 of the differential transistor pair 130 is coupled to the input terminal In2 of the current-mode interpolation buffer 100 for receiving a rough voltage Vin2. A control terminal C4 of the differential transistor pair 130 is coupled to the output terminal of the current-mode interpolation buffer 100 for receiving the analog voltage VA. A reference terminal R2 of the differential transistor pair 130 is coupled to the current source 110 for draining the current In. A current terminal pair Td3 and Td4 of the differential transistor pair 130 generates a differential current Id3 and Id4.

An input terminal pair TP1 and TP2 of the output stage 140 is respectively coupled to the current terminal pair Td1 and Td2 of the differential transistor pair 120, and an input terminal pair TP3 and TP4 of the output stage 140 is respectively coupled to the current terminal pair Td3 and Td4 of the differential transistor pair 130. The output stage 140 converts the differential currents Id1-Id4 into voltage signals and superposes the voltage signals to generate the analog voltage VA for outputting, where the analog voltage VA belongs to a rough range from the rough voltage Vin1 to the rough voltage Vin2. For example, a magnitude of the analog voltage VA is between the rough voltage Vin1 and the rough voltage Vin2.

Those skilled in the art should understand that the output voltage of the differential transistor pair is a multiplication of a transconductance (gm) and the voltages Vin1 and Vin2 received by the control terminals C1 and C3, and the transconductance is proportional to amperages of the currents Ip and In drained or received by the differential transistor pairs 120 and 130. Therefore, the analog voltage VA can be represented by a following equation (1):

$$VA = \frac{M \times Vin1 + N \times Vin2}{M + N} \quad (1)$$

Where, M and N respectively represent amperage ratios of the currents Ip and In, for example, if Ip:In is 1:3, the analog voltage VA is then (¼)Vin1+(¾)Vin2. The second partial-bit SD of the digital code determines the amperage ratios of the currents Ip and In to determine a magnitude of the interpolation voltage. In the present embodiment, the differential transistor pair 120 is a P-channel metal oxide semiconductor (PMOS) transistor pair, and the differential transistor pair 130 is an N-channel metal oxide semiconductor (NMOS) transistor pair. Therefore, the magnitude of the interpolation voltage is less limited by a threshold voltage, which almost reaches a rail-to-rail voltage range.

Figure 3:
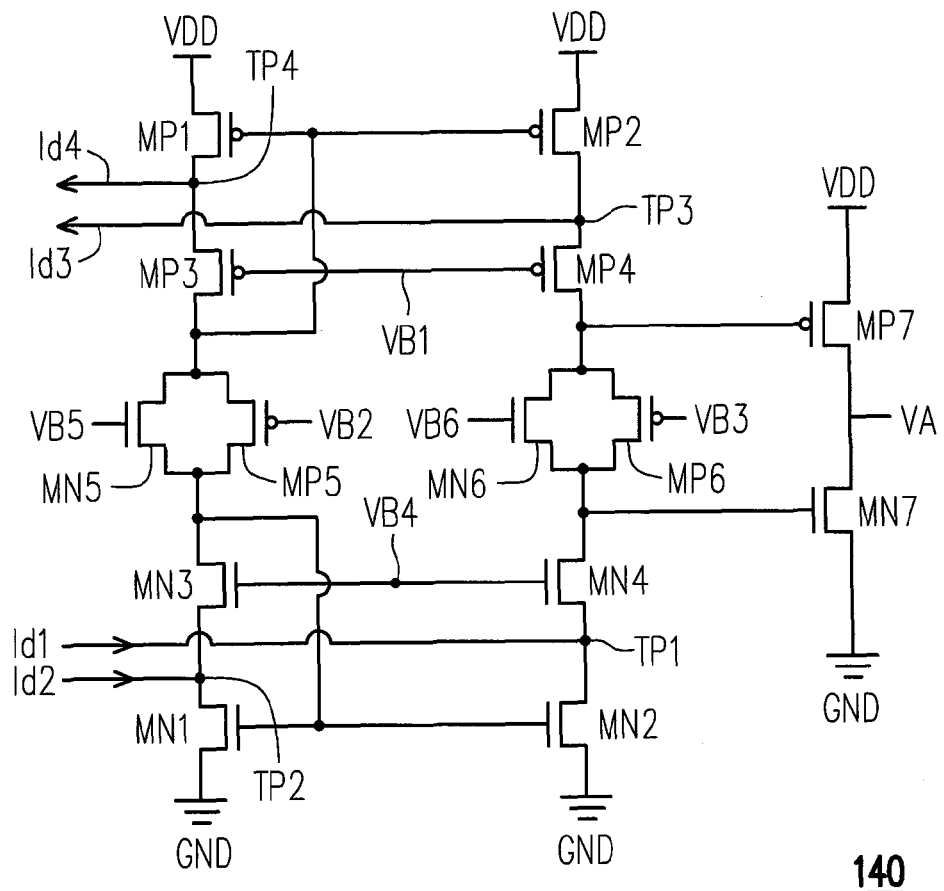
FIG. 3 is a circuit schematic diagram of an output stage of FIG. 2 according to an embedment of the invention.

FIG. 3 is a circuit schematic diagram of the output stage 140 of FIG. 2 according to an embedment of the invention. Referring to FIG. 3, the output stage 140 includes PMOS transistors MP1-MP7 and NMOS transistors MN1-MN7.

A first terminal (for example, a source) of the transistor MP1 is coupled to a first system voltage, in the present embodiment, the first system voltage is a power voltage VDD. A second terminal (for example, a drain) of the transistor MP1 is coupled to the current terminal Td4 of the current terminal pair of the differential transistor pair 130 for draining the differential current Id4. A first terminal (for example, a source) of the transistor MP2 is coupled to the power voltage VDD. A second terminal (for example, a drain) of the transistor MP2 is coupled to the current terminal Td3 of the current terminal pair of the differential transistor pair 130 for draining the differential current Id3. A control terminal (for example, a gate) of the transistor MP2 is coupled to a control terminal (for example, a gate) of the transistor MP1. A first terminal (for example, a source) of the transistor MP3 is coupled to the drain of the transistor MP1. A second terminal (for example, a drain) of the transistor MP3 is coupled to the gate of the transistor MP1. A control terminal (for example, a gate) of the transistor MP3 is coupled to a bias voltage VB1. A first terminal (for example, a source) of the transistor MP4 is coupled to the drain of the transistor MP2. A control terminal (for example, a gate) of the transistor MP4 is coupled to the bias voltage VB1. A first terminal (for example, a source) of the transistor MP5 is coupled to the drain of the transistor MP3. A control terminal (for example, a gate) of the transistor MP5 is coupled to a bias voltage VB2. A first terminal (for example, a source) of the transistor MP6 is coupled to the drain of the transistor MP4. A control terminal (for example, a gate) of the transistor MP6 is coupled to a bias voltage VB3. A first terminal (for example, a source) of the transistor MP7 is coupled to the power voltage VDD. A control terminal (for example, a gate) of the transistor MP7 is coupled to a drain of the transistor MP4.

A first terminal (for example, a source) of the transistor MN1 is coupled to a second system voltage, in the present embodiment, the second system voltage is a ground voltage GND. A second terminal (for example, a drain) of the transistor MN1 is coupled to the current terminal Td2 of the current terminal pair of the differential transistor pair 120. A first terminal (for example, a source) of the transistor MN2 is coupled to the ground voltage GND. A second terminal (for example, a drain) of the transistor MN2 is coupled to the current terminal Td1 of the current terminal pair of the differential transistor pair 120 for receiving the differential current Id1. A control terminal (for example, a gate) of the transistor MN2 is coupled to a control terminal (for example, a gate) of the transistor MN1. A first terminal (for example, a source) of the transistor MN3 is coupled to the drain of the transistor MN1. A second terminal (for example, a drain) of the transistor MN3 is coupled to the gate of the transistor MN1. A control terminal (for example, a gate) of the transistor MN3 is coupled to a bias voltage VB4. A first terminal (for example, a source) of the transistor MN4 is coupled to the drain of the transistor MN2. A control terminal (for example, a gate) of the transistor MN4 is coupled to the bias voltage VB4. A first terminal (for example, a source) of the transistor MN5 is coupled to the drain of the transistor MN3 and the drain of the transistor MP5. A second terminal (for example, a drain) of the transistor MN5 is coupled to the source of the transistor MP5. A control terminal (for example, a gate) of the transistor MN5 is coupled to a bias voltage VB5. A first terminal (for example, a source) of the transistor MN6 is coupled to the drain of the transistor MN4 and the drain of the transistor MP6. A second terminal (for example, a drain) of the transistor MN6 is coupled to the source of the transistor MP6. A control terminal (for example, a gate) of the transistor MN6 is coupled to a bias voltage VB6. A first terminal (for example, a source) of the transistor MN7 is coupled to the ground voltage GND. A second terminal (for example, a drain) of the transistor MN7 is coupled to the drain of the transistor MP7 for commonly outputting the analog voltage VA. A control terminal (for example, a gate) of the transistor MN7 is coupled to a drain of the transistor MN4.

Figure 4:
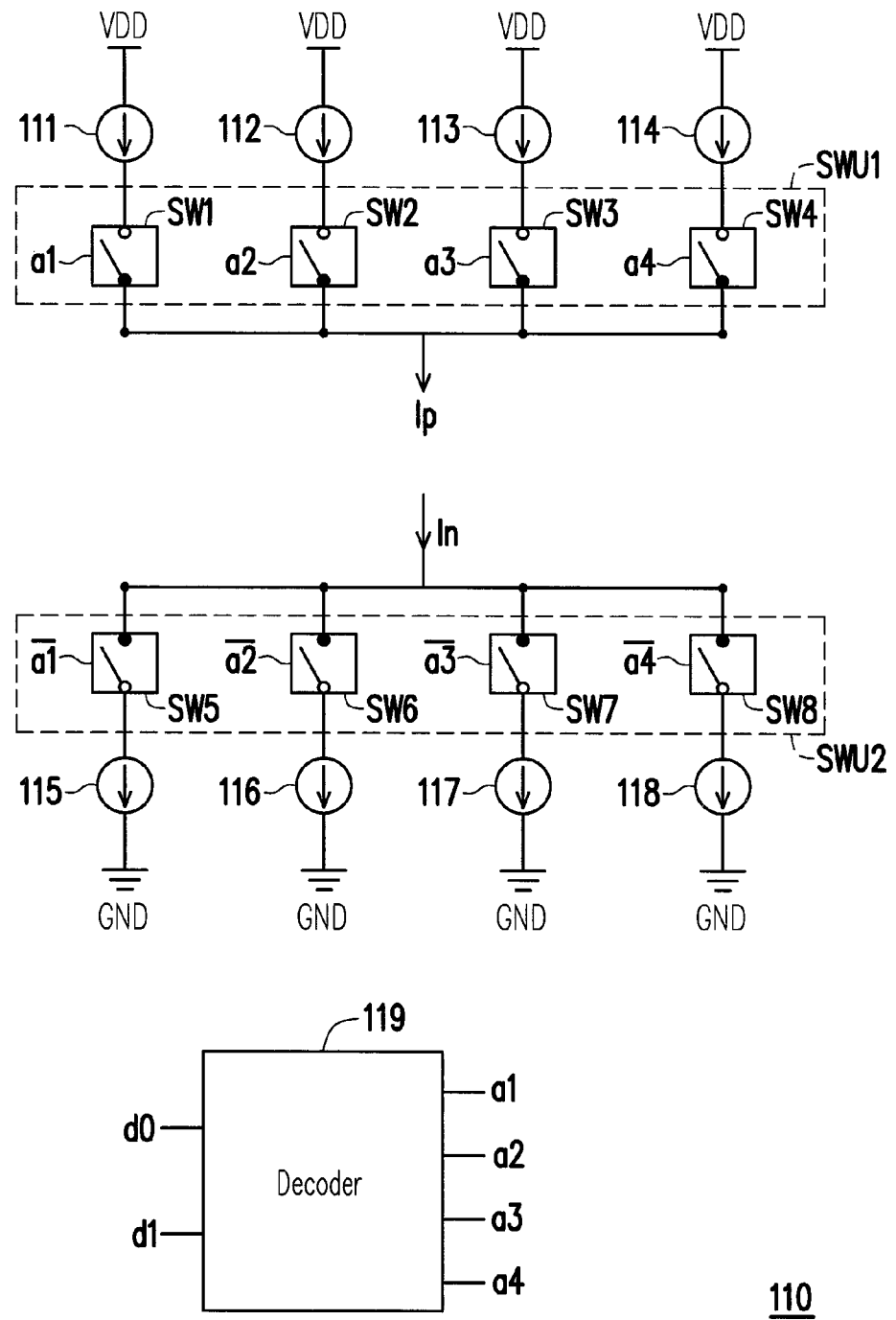
FIG. 4 is a circuit schematic diagram of a current source of FIG. 2 according to an embodiment of the invention.

FIG. 4 is a circuit schematic diagram of the current source 110 of FIG. 2 according to an embodiment of the invention. In the present embodiment, the second partial-bit SD of the digital code shown in FIG. 1 includes a $0^{th}$ bit d0 and a first bit d1, though the invention is not limited thereto, and in other embodiments, the number of bits of the second partial-bit SD of the digital code can be one bit, 3 bits or more bits. Referring to FIG. 4, the current source 110 includes unit current sources 111-118 and a switch unit SWU1. Each of the unit current sources 111-114 provides/outputs 1 unit amperage (Iunit). The switch unit SWU1 includes switches SW1-SW4, which are respectively coupled to the unit current sources 111-114 for receiving currents. Another terminal of each of the switches SW1-SW4 is coupled to the reference terminal R1 of the differential transistor pair 120. According to the bits d0 and d1 of the digital code, a decoder 119 correspondingly outputs control signals a1-a4 to control terminals of the switches SW1-SW4 to determine conducting states of the switches SW1-SW4. Therefore, the switches SW1-SW4 can determine an amperage magnitude of the current Ip provided to the differential transistor pair 120 according to the bits d0 and d1 of the digital code. The bits d0 and d1 can turn on all of the switches SW1-SW4, and the amperage of the current Ip received by the differential transistor pair 120 is 4 Iunit (4 unit amperage). Deduced by analogy, the bits d0 and d1 can also turn off all of the switches SW1-SW4, and the current Ip is 0. Alternatively, the bits d0 and d1 can turn on a part of the switches SW1-SW4, so that the amperage of the current Ip is between 1 Iunit and 3 Iunit.

Similarly, each of the unit current sources 115-118 draws 1 unit amperage (Iunit). The switch unit SWU2 includes switches SW5-SW8, which are respectively coupled to the unit current sources 115-118 for receiving currents. Another terminal of each of the switches SW5-SW8 is coupled to the reference terminal R2 of the differential transistor pair 130. According to the bits d0 and d1 of the digital code, the decoder 119 correspondingly outputs inverted signals $\overline{a1}$-$\overline{a4}$ of the control signals a1-a4 to control terminals of the switches SW5-SW8 to determine conducting states of the switches SW5-SW8. Therefore, the switches SW5-SW8 can determine an amperage magnitude of the current In provided to the differential transistor pair 130.

Where, a relationship between the bits d0 and d1 and the control signals a1-a4 is as that shown in a following table 1. Table 1 is a truth table of the decoder 119.

TABLE 1 truth table of the decoder 119

| d0 | d1 | a1 | a2 | a3 | a4 |
|----|----|----|----|----|----|
| 0  | 0  | 0  | 0  | 0  | 0  |
| 0  | 1  | 0  | 0  | 0  | 1  |
| 1  | 0  | 0  | 0  | 1  | 1  |
| 1  | 1  | 0  | 1  | 1  | 1  |

Table 2 lists a relationship between the currents Ip and In of the current source 110, the input rough voltages Vin1 and Vin2 and the output analog voltage VA in the current-mode interpolation buffer 100 of FIG. 2. The table 2 is obtained according to the equation 1.

TABLE 2 relationship between the current and the output voltage VA of the buffer 100

| Ip | In | VA |
|----|----|----|
| 3 Iunit | 1 Iunit | 1/4 Vin2 + 3/4 Vin1 |
| 2 Iunit | 2 Iunit | 1/2 Vin2 + 1/2 Vin1 |
| 1 Iunit | 3 Iunit | 3/4 Vin2 + 1/4 Vin1 |

According to the table 1 and the table 2, it is known that by suing the switch units SWU1 and SWU2 of the current source 110, three reference voltages can be interpolated within the voltage range of the rough voltages Vin1 and Vin2. Therefore, the current-mode interpolation buffer 100 of the present embodiment can provide the interpolation analog voltage VA according to the second partial-bit SD (for example, the bits d0 and d1) of the digital code, and the analog voltage VA is between the voltage range from the first rough voltage Vin1 to the second rough voltage Vin2.

However, in other embodiments, considering an actual product design requirement, in case that a voltage level of the rough voltage Vin1 (or Vin2) is close to the power voltage VDD or close to the ground voltage GND, a voltage-current characteristic curve of the current-mode interpolation buffer 100 probably becomes non-linear, and interpolation effect of the current-mode interpolation buffer 100 performed on the rough voltage Vin1 and Vin2 is not good. Therefore, in another embodiment, if the rough voltage Vin1 (or Vin2) is close to the power voltage VDD (or close to the ground voltage GND), the current-mode interpolation buffer 100 does not perform the interpolation on the rough voltages Vin1 and Vin2.

Figure 5:
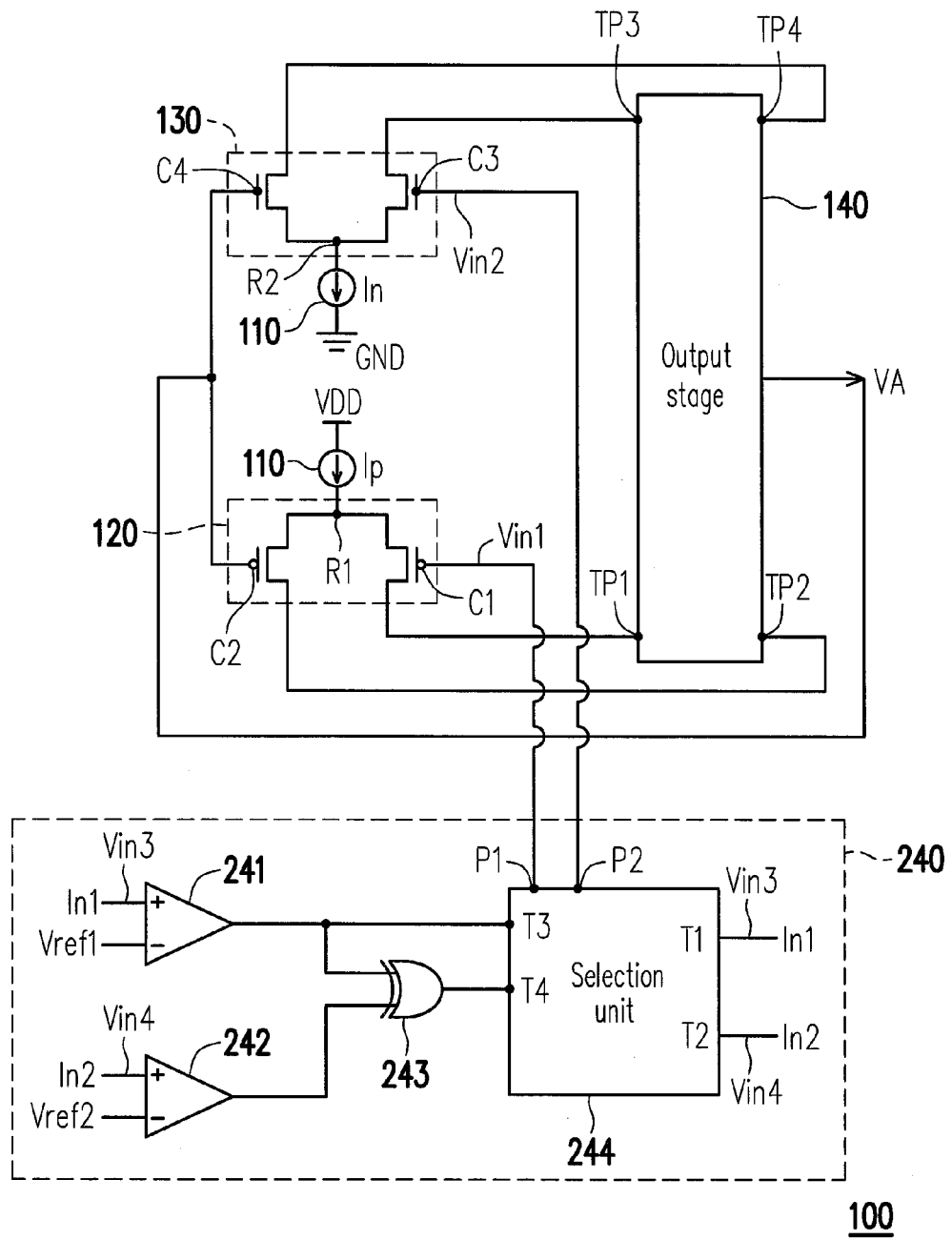
FIG. 5 is a circuit schematic diagram of the current-mode interpolation buffer of FIG. 1 according to another embodiment of the invention.

FIG. 5 is a circuit schematic diagram of the current-mode interpolation buffer 100 of FIG. 1 according to another embodiment of the invention. Referring to FIG. 5, the current-mode interpolation buffer 100 includes the current source 110, the differential transistor pair 120, the differential transistor pair 130, the output stage 140 and a logic unit 240. Related descriptions of FIG. 2, FIG. 3 and FIG. 4 can be referred for the embodiment of FIG. 5. Different to the embodiment of FIG. 2, the current-mode interpolation buffer 100 of FIG. 5 further includes the logic unit 240. Referring to FIG. 1 and FIG. 5, the logic unit 240 includes a comparator 241, a comparator 242, an XOR gate 243 and a selection unit 244. A positive input terminal of the comparator 241 is coupled to the input terminal In1 of the current-mode interpolation buffer 100 for receiving a rough voltage Vin3. A negative input terminal of the comparator 241 is coupled to a reference voltage Vref1. A positive input terminal of the comparator 242 is coupled to the input terminal In2 of the current-mode interpolation buffer 100 for receiving a rough voltage Vin4. A negative input terminal of the comparator 242 is coupled to a reference voltage Vref2. Input terminals of the XOR gate 243 are coupled to an output terminal of the comparator 241 and an output terminal of the comparator 242, and an output terminal of the XOR gate 243 is coupled to the selection unit 244.

An input terminal T1 of the selection unit 244 is coupled to the input terminal In1 of the current-mode interpolation buffer 100 for receiving the rough voltage Vin3. An input terminal T2 of the selection unit 244 is coupled to the input terminal In2 of the current-mode interpolation buffer 100 for receiving the rough voltage Vin4. An input terminal T3 of the selection unit 244 is coupled to the output terminal of the comparator 241. An input terminal T4 of the selection unit 244 is coupled to the output terminal of the XOR gate 243. An output terminal P1 of the selection unit 244 is coupled to the control terminal C1 of the differential transistor pair 120. An output terminal P2 of the selection unit 244 is coupled to the control terminal C3 of the differential transistor pair 130. The selection unit 244 determines to output the rough voltage Vin3 and/or the rough voltage Vin4 to the control terminals C1 and C3 according to signals output from the output terminals of the comparator 241 and the XOR gate 243.

As shown in FIG. 5, in the present embodiment, it is assumed that the reference voltage Vref1 is a high level voltage (for example, 4*VDD/5) close to the power voltage VDD, and the reference voltage Vref2 is a low level voltage (for example, VDD/5) close to the ground voltage GND. When the rough voltage Vin3 is greater than the reference voltage Vref1, since the rough voltage Vin4 and the rough voltage Vin3 are two gamma voltages with a difference of one bit, the rough voltage Vin4 must be greater than the reference voltage Vref2, and the outputs of the comparator 241 and the comparator 242 are all logic high voltage level, and the output of the XOR gate 243 is a logic low voltage level. In response to the logic low voltage level output by the XOR gate 243 and the logic high voltage level output by the comparator 241, the selection unit 244 determines to take a higher one of the rough voltages Vin3 and Vin4 (for example, the rough voltage Vin3) as the rough voltages Vin1 and Vin2 for outputting to the control terminals C1 and C3 of the differential transistor pairs 120 and 130 through the output terminals P1 and P2. The control terminal C1 of the differential transistor pair 120 and the control terminal C3 of the differential transistor pair 130 receive the identical rough voltage Vin3, so that a voltage level of the analog voltage VA output by the current-mode interpolation buffer 100 is approximately equal to the rough voltage Vin3.

When the rough voltage Vin3 is smaller than the reference voltage Vref1 and the rough voltage Vin4 is greater than the reference voltage Vref2, the output of the comparator 241 is the logic low voltage level, and the output of the XOR gate 243 is the logic high voltage level, and now the selection unit 244 determines to take the rough voltage Vin3 as the rough voltage Vin1 for outputting to the control terminal C1 of the differential transistor pair 120 through the output terminal P1, and take the rough voltage Vin4 as the rough voltage Vin2 for outputting to the control terminal C3 of the differential transistor pair 130 through the output terminal P2. Related descriptions of FIG. 2-FIG. 4 can be referred for the interpolation operation of the differential transistor pair 120, the differential transistor pair 130 and the output stage 140, which is not repeated herein.

When the rough voltage Vin3 is smaller than the reference voltage Vref1 and the rough voltage Vin4 is smaller than the reference voltage Vref2, the output of the comparator 241 is the logic low voltage level, and the output of the XOR gate 243 is the logic low voltage level, and now the selection unit 244 determines to take a smaller one of the rough voltages Vin3 and Vin4 (for example, the rough voltage Vin4) as the rough voltages Vin1 and Vin2 for outputting to the control terminals C1 and C3 of the differential transistor pairs 120 and 130 through the output terminals P1 and P2. Now, the control terminal C1 of the differential transistor pair 120 and the control terminal C3 of the differential transistor pair 130 receive the identical rough voltage Vin4, so that a voltage level of the analog voltage VA output by the current-mode interpolation buffer 100 is approximately equal to the rough voltage Vin4.

TABLE 3 truth table of the selection unit 244

| T3 | T4 | P1 | P2 |
|---|---|---|---|
| 0 | 0 | Vin4 | Vin4 |
| 0 | 1 | Vin3 | Vin4 |
| 1 | 0 | Vin3 | Vin3 |

Figure 6:
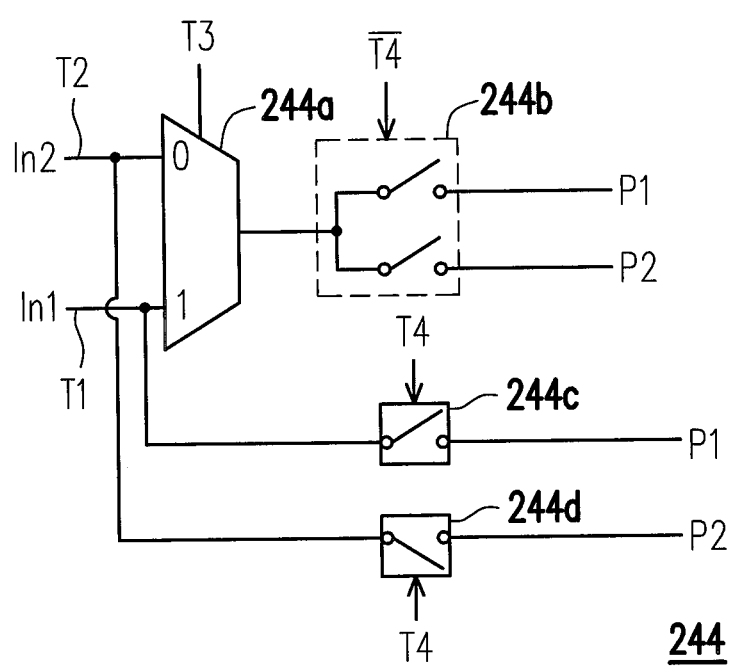
FIG. 6 is a circuit schematic diagram of the selection unit 244 of FIG. 5 according to an embodiment of the invention.

Selection behaviours of the selection unit 244 are as that shown in the table 3. Any circuit complied with the selection behaviours of the table 3 can be applied in the selection unit 244. For example, FIG. 6 is a circuit schematic diagram of the selection unit 244 of FIG. 5 according to an embodiment of the invention. In other embodiment, the selection unit 244 of FIG. 5 can be implemented through other method different to that of FIG. 6.

Referring to FIG. 6, the selection unit 244 includes a multiplexer 244a, a switch 244b, a switch 244c and a switch 244d. Input terminals of the multiplexer 244a serve as the input terminals T1 and T2 of the selection unit 244 for coupling to the input terminals In1 and In2 of the current-mode interpolation buffer 100. A control terminal of the multiplexer 244a serves as the input terminal T3 of the selection unit 244 for coupling to the output terminal of the comparator 241. The multiplexer 244a determines to output one of the rough voltage Vin3 and the rough voltage Vin4 according to the output of the comparator 241. A common terminal of the switch 244b is coupled to an output terminal of the multiplexer 244a. A first output terminal and a second output terminal of the switch 244b are respectively coupled to the output terminals P1 and P2 of the selection unit 244. A control terminal of the switch 244b serves as the input terminal T4 of the selection unit 244 for coupling to the output terminal of the XOR gate 243. According to the output of the XOR gate 243, the switch 244b determines whether or not to take the output of the multiplexer 244a as the rough voltages Vin1 and Vin2 for outputting to the control terminal C1 and the control terminal C3 of the differential transistor pairs 120 and 130.

The switch 244c is coupled between the input terminal T1 and the output terminal P1 of the selection unit 244. The switch 244d is coupled between the input terminal T2 and the output terminal P2 of the selection unit 244. Under control of an inverting signal of the output terminal of the XOR gate 243, when the switch 244b is turned off, the switches 244c and 244d are turned on. When the switch 244b is turned on, the switches 244c and 244d are turned off. Therefore, the switches 244c and 244d can determine whether or not to take the rough voltages Vin3 and Vin4 as the rough voltages Vin1 and Vin2 for outputting to the control terminal C1 and the control terminal C3 of the differential transistor pairs 120 and 130 according to the inverting signal of the output terminal of the XOR gate 243.

Figure 7:
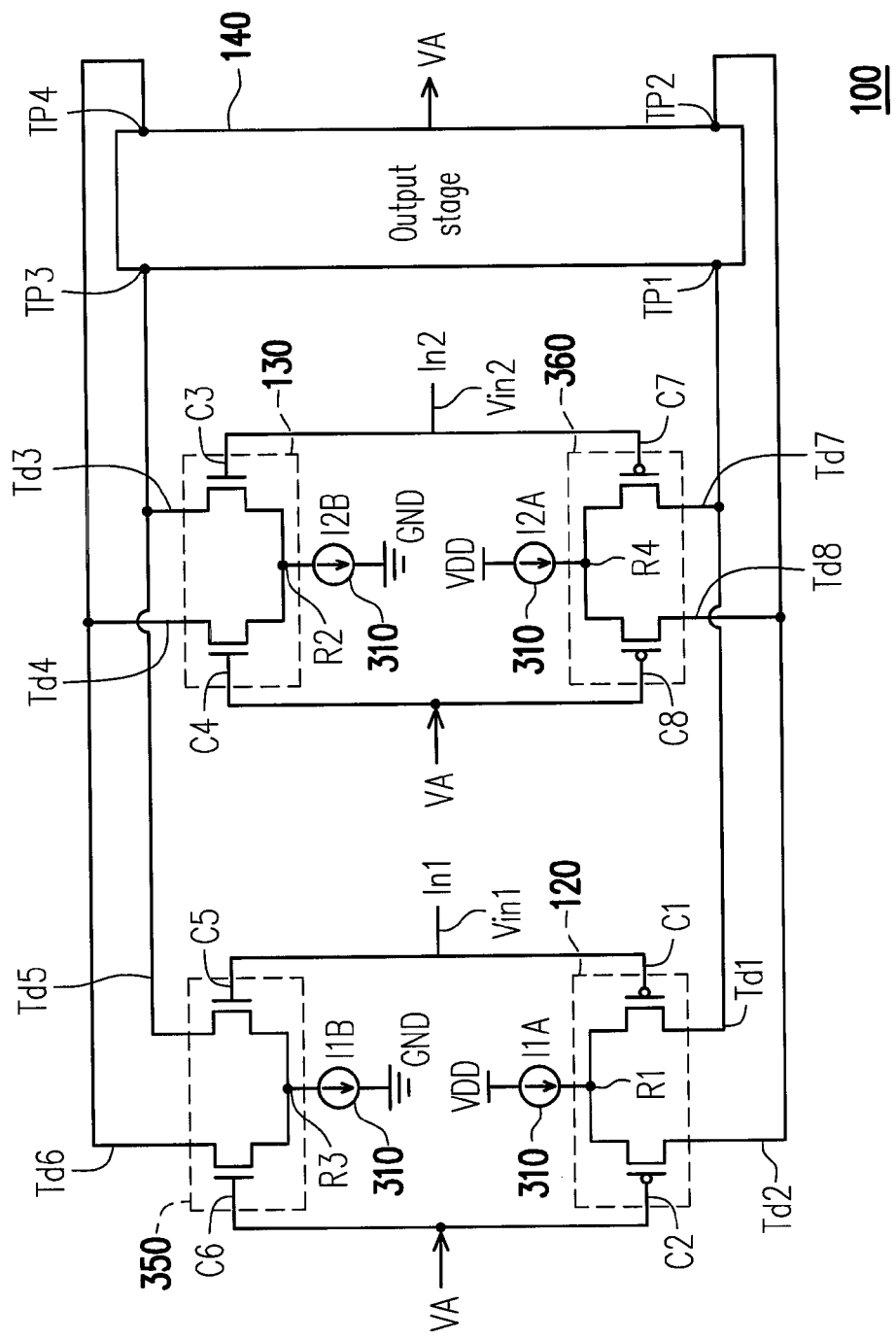
FIG. 7 is a circuit schematic diagram of the current-mode interpolation buffer of FIG. 1 according to still another embodiment of the invention.

FIG. 7 is a circuit schematic diagram of the current-mode interpolation buffer 100 of FIG. 1 according to still another embodiment of the invention. The current-mode interpolation buffer 100 includes a current source 310, the differential transistor pair 120, the differential transistor pair 130, a differential transistor pair 350, a differential transistor pair 360 and the output stage 140. Related descriptions of FIG. 2 and FIG. 3 can be referred for the embodiment of FIG. 7. Different to the embodiment of FIG. 2, the current-mode interpolation buffer 100 of FIG. 7 further includes the differential transistor pair 350 and the differential transistor pair 360. Besides, the current source 310 of FIG. 7 can correspondingly draw currents I1B and I2B and output currents I1A and I2A.

Referring to FIG. 7, the control terminal C1 of the differential transistor pair 120 is coupled to the input terminal In1 of the current-mode interpolation buffer 100 for receiving the rough voltage Vin1. The control terminal C2 of the differential transistor pair 120 is coupled to the analog voltage VA. The reference terminal R1 of the differential transistor pair 120 is coupled to the current source 310 for receiving the current I1A. The current terminal pair Td1, Td2 of the differential transistor pair 120 is coupled to the input terminal pair TP1 and TP2 of the output stage 140. The control terminal C3 of the differential transistor pair 130 is coupled to the input terminal In2 of the current-mode interpolation buffer 100 for receiving the rough voltage Vin2. The control terminal C4 of the differential transistor pair 130 is coupled to the analog voltage VA. The reference terminal R2 of the differential transistor pair 130 is coupled to the current source 310 for draining the current I2B. The current terminal pair Td3 and Td4 of the differential transistor pair 130 is coupled to the input terminal pair TP3 and TP4 of the output stage 140.

A control terminal C5 of the differential transistor pair 350 is coupled to the input terminal In1 of the current-mode interpolation buffer 100 for receiving the rough voltage Vin1. A control terminal C6 of the differential transistor pair 350 receives the analog voltage VA. A reference terminal R3 of the differential transistor pair 350 is coupled to the current source 310 for draining the current I1B. A current terminal pair Td5 and Td6 of the differential transistor pair 350 is coupled to the input terminal pair TP3 and TP4 of the output stage 140. A control terminal C7 of the differential transistor pair 360 is coupled to the input terminal In2 of the current-mode interpolation buffer 100 for receiving the rough voltage Vin2. A control terminal C8 of the differential transistor pair 360 receives the analog voltage VA. A reference terminal R4 of the differential transistor pair 360 is coupled to the current source 310 for receiving the current I2A. A current terminal pair Td7 and Td8 of the differential transistor pair 360 is coupled to the input terminal pair TP1 and TP2 of the output stage 140.

The output stage 140 receives the differential currents of the differential transistor pairs 120, 130, 350 and 360, and converts the current signals into voltage signals and superposes the voltage signals to output the analog voltage VA.

Similarly, those skilled in the art should understand that the output voltage of the differential transistor pair is a multiplication of the transconductance and the input voltages, and the transconductance is proportional to the reference current drained or received by the differential transistor pair, so that the superposing result of the voltages that are converted from the differential currents input to the output stage 140 by the differential transistor pair 120, 130, 350 and 360 can be represented by a following equation (2):

$$VA = \frac{P \times Vin1 + Q \times Vin2}{P + Q} \quad (2)$$

Where, P and Q respectively represent amperage ratios between the currents I1A and I2A as well as amperage ratios between the currents I1B and I2B, for example, if I1A:I2A is 1:3, the analog voltage VA is then (¼)Vin1+(¾)Vin2.

Figure 8:
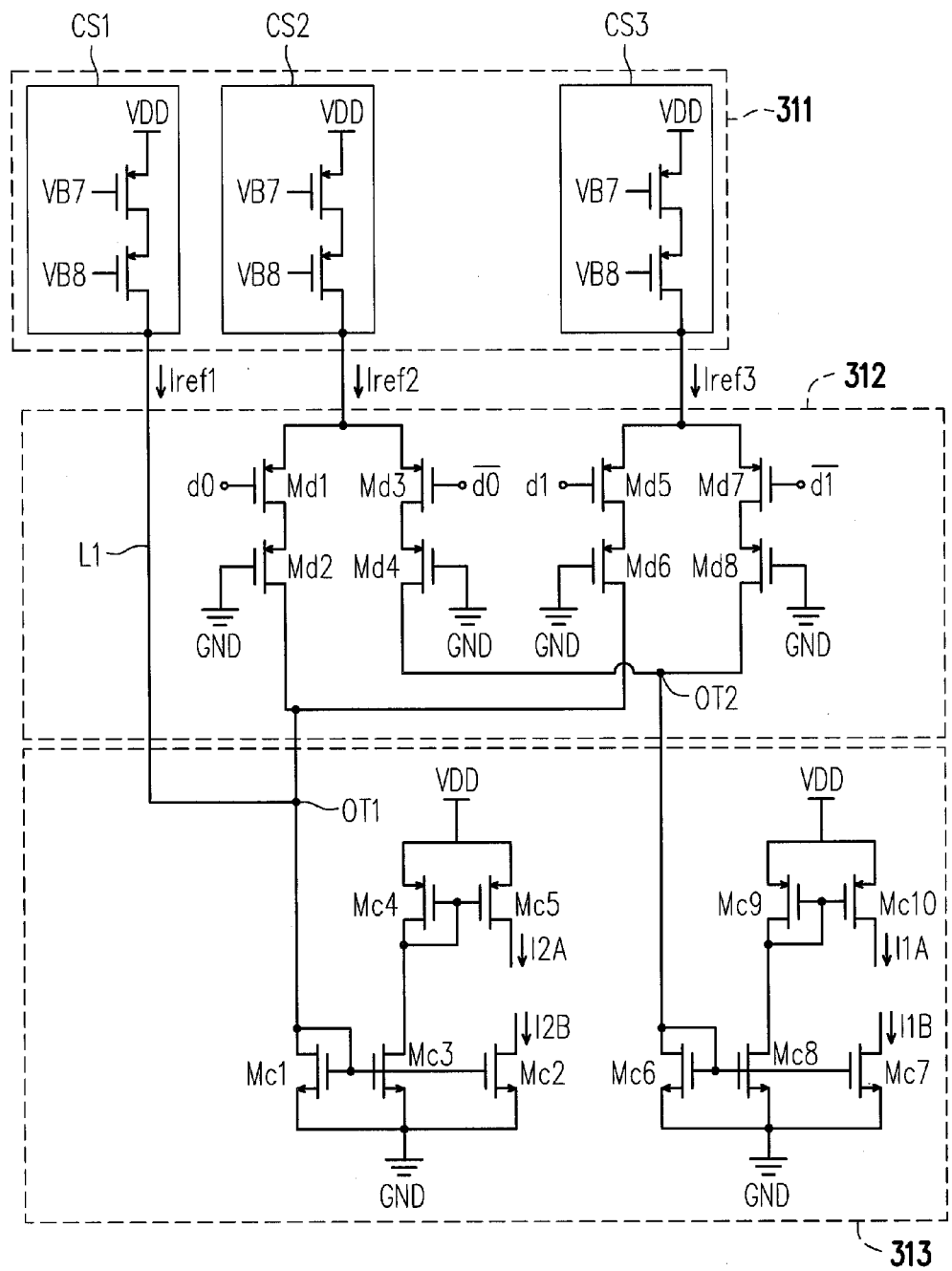
FIG. 8 is a circuit schematic diagram of a current source of FIG. 7 according to an embodiment of the invention.

FIG. 8 is a circuit schematic diagram of the current source 310 of FIG. 7 according to an embodiment of the invention. In the present embodiment, the second partial-bit SD of the digital code shown in FIG. 1 includes the $0^{th}$ bit d0 and the first bit d1, though the invention is not limited thereto, and in other embodiments, the number of bits of the second partial-bit SD of the digital code can be one bit, 3 bits or more bits. Referring to FIG. 8, the current source 110 includes a current providing circuit 311, a switch circuit 312 and a current collecting circuit 313. The current providing circuit 311 includes a current source circuit CS1, a current source circuit CS2 and a current source circuit CS3. The current source circuits CS1, CS2 and CS3 can be implemented by any means. For example, in the embodiment of FIG. 8, two PMOS transistors connected in series are used to implement a current source circuit, where gates of the two PMOS transistors are respectively controlled by bias voltages VB7 and VB8. However, implementation of the current source circuit CS1, CS2 and CS3 is not limited to the embodiment of FIG. 8. An output terminal of the current source circuit CS1 provides a reference current Iref1, an output terminal of the current source circuit CS2 provides a reference current Iref2, and an output terminal of the current source circuit CS3 provides a reference current Iref3. In the present embodiment, the reference current Iref2 is twice of the reference current Iref1, and the reference current Iref3 is equal to the reference current Iref1.

The switch circuit 312 includes a wire L1 and PMOS transistors Md1-Md8. Two ends of the wire L1 are respectively coupled to the output terminal of the current source circuit CS1 and an output terminal OT1 of the switch circuit 312. A first terminal (for example, a source) of the transistor Md1 is coupled to the output terminal of the current source circuit CS2. A control terminal (for example, a gate) of the transistor Md1 receives the bit d0 of the digital code. A first terminal (for example, a source) of the transistor Md2 is coupled to a second terminal (for example, a drain) of the transistor Md1. A second terminal (for example, a drain) of the transistor Md2 is coupled to the output terminal OT1 of the switch circuit 312. A control terminal (for example, a gate) of the transistor Md2 is coupled to a system voltage (for example, the ground voltage GND). A first terminal (for example, a source) of the transistor Md3 is coupled to the output terminal of the current source circuit CS2. A control terminal (for example, a gate) of the transistor Md3 receives an inverting signal $\overline{d0}$ of the bit d0 of the digital code. A first terminal (for example, a source) of the transistor Md4 is coupled to a second terminal (for example, a drain) of the transistor Md3. A second terminal (for example, a drain) of the transistor Md4 is coupled to an output terminal OT2 of the switch circuit 312. A control terminal (for example, a gate) of the transistor Md4 is coupled to the ground voltage GND.

A first terminal (for example, a source) of the transistor Md5 is coupled to the output terminal of the current source circuit CS3. A control terminal (for example, a gate) of the transistor Md5 receives the bit d1 of the digital code. A first terminal (for example, a source) of the transistor Md6 is coupled to a second terminal (for example, a drain) of the transistor Md5. A second terminal (for example, a drain) of the transistor Md6 is coupled to the output terminal OT1 of the switch circuit 312. A control terminal (for example, a gate) of the transistor Md6 is coupled to the ground voltage GND. A first terminal (for example, a source) of the transistor Md7 is coupled to the output terminal of the current source circuit CS3. A control terminal (for example, a gate) of the transistor Md7 receives an inverting signal $\overline{d1}$ of the bit d1 of the digital code. A first terminal (for example, a source) of the transistor Md8 is coupled to a second terminal (for example, a drain) of the transistor Md7. A second terminal (for example, a drain) of the transistor Md8 is coupled to the output terminal OT2 of the switch circuit 312. A control terminal (for example, a gate) of the transistor Md8 is coupled to the ground voltage GND. The transistors Md2, Md4, Md6 and Md8 are used to mitigate a problem of glitch occurred during a transition process of the bits d0 and d1 of the digital code.

The current collecting circuit 313 includes NMOS transistors Mc1-Mc3, PMOS transistors Mc4-Mc5, NMOS transistors Mc6-Mc8 and PMOS transistors Mc9-Mc10. A first terminal (for example, a drain) of the transistor Mc1 is coupled to the output terminal OT1 of the switch circuit 312. A second terminal (for example, a source) of the transistor Mc1 is coupled to a first system voltage (for example, the ground voltage GND). A control terminal (for example, a gate) of the transistor Mc1 is coupled to the drain of the transistor Mc1. A first terminal (for example, a drain) of the transistor Mc2 is coupled to the reference terminal R2 of the differential transistor pair 130 for drawing the current I2B. A second terminal (for example, a source) of the transistor Mc2 is coupled to the ground voltage GND. A control terminal (For example, a gate) of the transistor Mc2 is coupled to the gate of the transistor Mc1. A first terminal (for example, a source) of the transistor Mc3 is coupled to the ground voltage GND. A control terminal (for example, a gate) of the transistor Mc3 is coupled to the gate of the transistor Mc1. A first terminal (for example, a source) of the transistor Mc4 is coupled to a second system voltage (for example, the power voltage VDD). A second terminal (for example, a drain) of the transistor Mc4 is coupled to a second terminal (for example, a drain) of the transistor Mc3. A control terminal (for example, a gate) of the transistor Mc4 is coupled to the drain of the transistor Mc4. A first terminal (for example, a source) of the transistor Mc5 is coupled to the power voltage VDD. A second terminal (for example, a drain) of the transistor Mc5 is coupled to the reference terminal R4 of the differential transistor pair 360 for outputting the current I2A. A control terminal (for example, a gate) of the transistor Mc5 is coupled to the gate of the transistor Mc4. By adjusting channel aspect ratios of the transistors Mc1-Mc5, a ratio of the current I2A and the current I2B can be set to 1:1.

A first terminal (for example, a drain) of the transistor Mc6 is coupled to the output terminal OT2 of the switch circuit 312. A second terminal (for example, a source) of the transistor Mc6 is coupled to the ground voltage GND. A control terminal (for example, a gate) of the transistor Mc6 is coupled to the drain of the transistor Mc6. A first terminal (for example, a drain) of the transistor Mc7 is coupled to the reference terminal R3 of the differential transistor pair 350 for drawing the current I1B. A second terminal (for example, a source) of the transistor Mc7 is coupled to the ground voltage GND. A control terminal (For example, a gate) of the transistor Mc7 is coupled to the gate of the transistor Mc6. A first terminal (for example, a source) of the transistor Mc8 is coupled to the ground voltage GND. A control terminal (for example, a gate) of the transistor Mc8 is coupled to the gate of the transistor Mc6. A first terminal (for example, a source) of the transistor Mc9 is coupled to the power voltage VDD. A second terminal (for example, a drain) of the transistor Mc9 is coupled to a second terminal (for example, a drain) of the transistor Mc8. A control terminal (for example, a gate) of the transistor Mc9 is coupled to the drain of the transistor Mc9. A first terminal (for example, a source) of the transistor Mc10 is coupled to the power voltage VDD. A second terminal (for example, a drain) of the transistor Mc10 is coupled to the reference terminal R1 of the differential transistor pair 120 for outputting the current I1A. A control terminal (for example, a gate) of the transistor Mc10 is coupled to the gate of the transistor Mc9. By adjusting channel aspect ratios of the transistors Mc6-Mc10, a ratio of the current I1A and the current I1B can be set to 1:1.

Referring to FIG. 8, if the bits d0 and d1 are all logic high voltage level, the transistor Md3 and the transistor Md7 are all turned on, and the transistor Md1 and the transistor Md5 are turned off. Therefore, the reference current Iref2 and the reference current Iref3 flow to the output terminal OT2, and only the reference current Iref1 flow to the output terminal OT1. In the present embodiment, since the reference current Iref2 is twice of the reference current Iref1, and the reference current Iref3 is equal to the reference current Iref1, a current ratio of the output terminal OT1 and the output terminal OT2 is 1:3.

The current collecting circuit 313 maps the currents of the output terminal OT1 and the output terminal OT2 by using a current mirror, so that a ratio of the currents I1A and I2A is 3:1, and a ratio of the currents I1B and I2B is also 3:1.

According to the equation (2), a relationship of the analog voltage VA, the rough voltages Vin1 and Vin2 and the amperage ratio of the currents I1A and I2A is known, so that VA=(¼)Vin2+(¾)Vin1.

If the bit d0 is the logic high voltage level and the bit d1 is the logic low voltage level, the transistor Md3 and the transistor Md5 are all turned on, and the transistor Md1 and the transistor Md7 are turned off. Therefore, the reference current Iref1 and the reference current Iref3 flow to the output terminal OT1, and only the reference current Iref2 flow to the output terminal OT2. Therefore, the ratio of the currents I1A and I2A is 1:1, and the ratio of the currents I1B and I2B is also 1:1. The analog voltage VA can be represented as (½)Vin1+(½)Vin2.

If the bit d0 is the logic low voltage level and the bit d1 is the logic high voltage level, the transistor Md1 and the transistor Md7 are all turned on, and the transistor Md3 and the transistor Md5 are turned off. Therefore, the reference current Iref1 and the reference current Iref2 flow to the output terminal OT1, and only the reference current Iref3 flow to the output terminal OT2. Therefore, the ratio of the currents I1A and I2A is 1:3, and the ratio of the currents I1B and I2B is also 1:3. Now, the analog voltage VA can be represented as (¾)Vin2+(¼)Vin1.

If the bits d0 and d1 are all the logic low voltage level, the transistor Md1 and the transistor Md5 are all turned on, and the transistor Md3 and the transistor Md7 are turned off. Therefore, the reference current Iref1, the reference current Iref2 and the reference current Iref3 flow to the output terminal OT1, and no current flow to the output terminal OT2. Therefore, the ratio of the currents I1A and I2A is 0:4, and the ratio of the currents I1B and I2B is also 0:4. Now, the analog voltage VA can be represented as Vin2.

In a following table 4, a relationship between the rough voltages Vin1 and Vin2 and the bits d0 and d1 is clearly presented, in which 0 represents the logic low voltage level, and 1 represents the logic high voltage level.

TABLE 4 relationship between the currents and the output voltage VA of the buffer 100

| d0 | d1 | I2A, I2B | I1A, I1B | VA |
|----|----|----------|----------|-----|
| 0 | 0 | 4 Iref1 | 0 | Vin2 |
| 0 | 1 | 3 Iref1 | 1 Iref1 | (3/4)Vin2 + (1/4)Vin1 |
| 1 | 0 | 2 Iref1 | 2 Iref1 | (1/2)Vin2 + (1/2)Vin1 |
| 1 | 1 | 1 Iref1 | 3 Iref1 | (1/4)Vin2 + (3/4)Vin1 |

Figure 9:
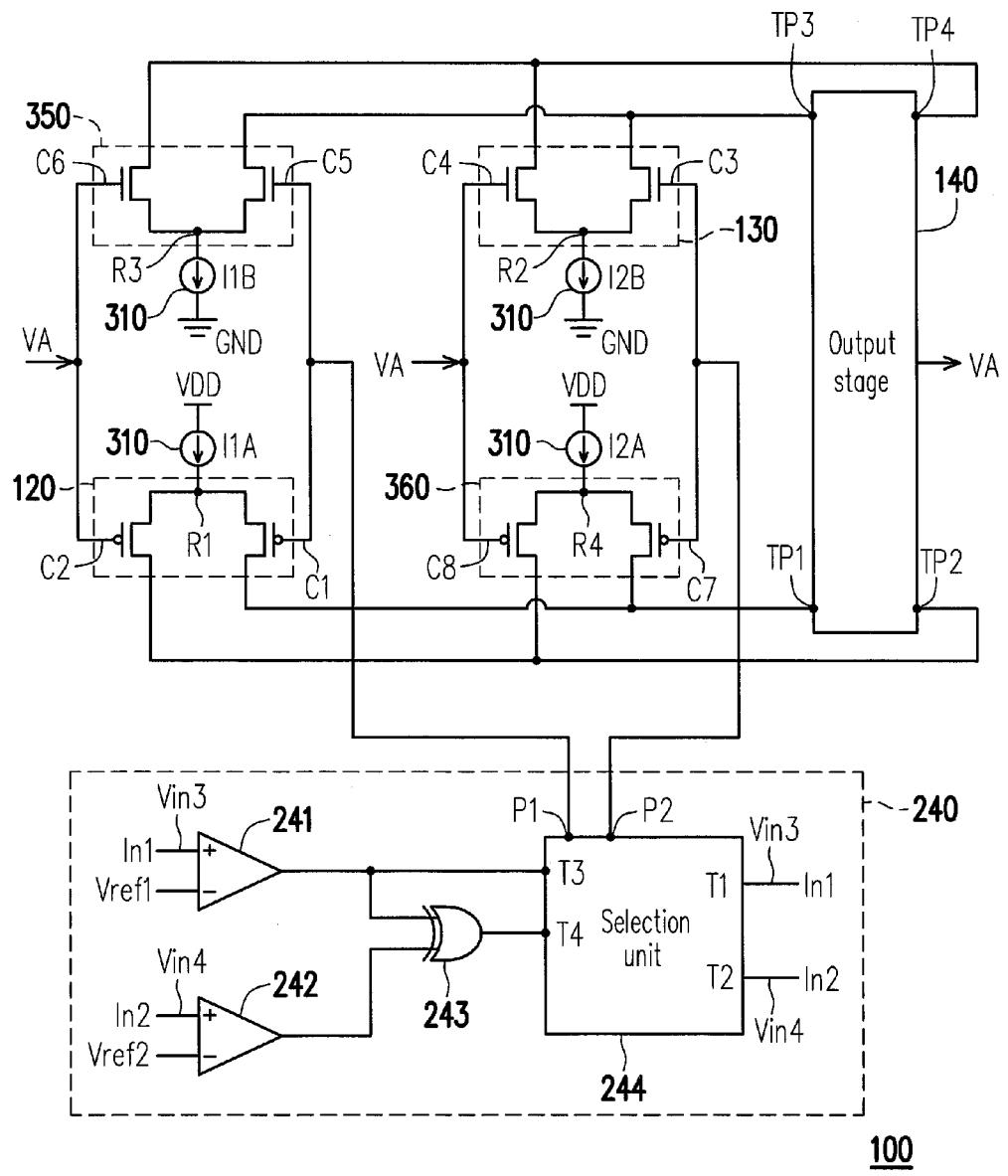
FIG. 9 is a circuit schematic diagram of the current-mode interpolation buffer of FIG. 1 according to yet another embodiment of the invention.

FIG. 9 is a circuit schematic diagram of the current-mode interpolation buffer 100 of FIG. 1 according to yet another embodiment of the invention. Related descriptions of FIG. 7 and FIG. 8 can be referred for the embodiment of FIG. 9. Different to the embodiment of FIG. 7, the current-mode interpolation buffer 100 of FIG. 9 further includes the logic unit 240. The logic unit 240 can be deduced according to the related descriptions of FIG. 5 and FIG. 6.

Similarly, the logic unit 240 of FIG. 9 is coupled to the input terminals In1 and In2 of the current-mode interpolation buffer 100 for receiving the rough voltages Vin3 and Vin4, so that when the rough voltages Vin3 and Vin4 are all close to the power voltage VDD, the logic unit 240 takes the rough voltage with a higher voltage level (for example, the rough voltage Vin3) as the rough voltages Vin1 and Vin2 for outputting to the control terminals C1, C3, C5 and C7 of the differential transistor pairs 120, 130, 350 and 360. When the rough voltages Vin3 and Vin4 are all close to the ground voltage GND, the logic unit 240 takes the rough voltage with a lower voltage level (for example, the rough voltage Vin4) as the rough voltages Vin1 and Vin2 for outputting to the control terminals C1, C3, C5 and C7 of the differential transistor pairs 120, 130, 350 and 360. When the rough voltage Vin3 is not greater than the reference voltage Vref1 and the rough voltage is not smaller than the reference voltage Vref2, the logic unit 240 outputs the rough voltage Vin3 to the control terminals C1 and C5 of the differential transistor pairs 120 and 350 to serve as the rough voltage Vin1, and outputs the rough voltage Vin4 to the control terminals C3 and C7 of the differential transistor pairs 130 and 360 to serve as the rough voltage Vin2. Now, the current-mode interpolation buffer 100 activates the interpolation operation.

In summary, the current-mode interpolation buffer 100 of the aforementioned embodiments can interpolate to obtain the analog voltage VA within a voltage range between the two rough voltages received by the input terminals In1 and In2 according to the second partial-bit SD of the digital code. The digital-to-analog conversion apparatus 10 can reduce a number of bits of the DAC 11 by using the current-mode interpolation buffer 100. The DAC 11 outputs the two rough voltages having the corresponding levels to the input terminals In1 and In2 of the current-mode interpolation buffer 100 according to the first partial-bit FD of the digital code. The current-mode interpolation buffer 100 provides the interpolation voltage VA within the voltage range between the first and the second rough voltages according to the second partial-bit SD of the digital code. Therefore, the buffer 100 can reduce a chip area of the DAC 11.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A current-mode interpolation buffer, for receiving a first rough voltage, a second rough voltage and at least one bit of a digital code and outputting an analog voltage, the current-mode interpolation buffer comprising:

a current source, receiving the at least one bit of the digital code, outputting a first current, and drawing a second current, wherein amperages of the first current and the second current are dependent on the at least one bit;

a first differential transistor pair, having a first control terminal and a second control terminal respectively receiving the first rough voltage and the analog voltage, a reference terminal coupled to the current source for receiving the first current, and a current terminal pair generating a first differential current;

a second differential transistor pair, having a first control terminal and a second control terminal respectively receiving the second rough voltage and the analog voltage, a reference terminal coupled to the current source for draining the second current, and a current terminal pair generating a second differential current; and an output stage, having a first input terminal pair and a second input terminal pair respectively coupled to the current terminal pair of the first differential transistor pair and the current terminal pair of the second differential transistor pair, and generating the analog voltage according to the first differential current and the second differential current, wherein the analog voltage belongs to a rough range from the first rough voltage to the second rough voltage.

2. The current-mode interpolation buffer as claimed in claim 1, wherein the output stage comprises:
- a first P-type transistor, having a first terminal coupled to a first system voltage, a second terminal coupled to a first current terminal of the current terminal pair of the second differential transistor pair;
- a second P-type transistor, having a first terminal coupled to the first system voltage, a second terminal coupled to a second current terminal of the current terminal pair of the second differential transistor pair, and a control terminal coupled to a control terminal of the first P-type transistor;
- a third P-type transistor, having a first terminal coupled to the second terminal of the first P-type transistor, a second terminal coupled to the control terminal of the first P-type transistor, and a control terminal coupled to a first bias voltage;
- a fourth P-type transistor, having a first terminal coupled to the second terminal of the second P-type transistor, and a control terminal coupled to the first bias voltage;
- a fifth P-type transistor, having a first terminal coupled to the second terminal of the third P-type transistor, and a control terminal coupled to a second bias voltage;
- a sixth P-type transistor, having a first terminal coupled to a second terminal of the fourth P-type transistor, and a control terminal coupled to a third bias voltage;
- a seventh P-type transistor, having a first terminal coupled to the first system voltage, and a control terminal coupled to the second terminal of the fourth P-type transistor;
- a first N-type transistor, having a first terminal coupled to a second system voltage, a second terminal coupled to a first current terminal of the current terminal pair of the first differential transistor pair;
- a second N-type transistor, having a first terminal coupled to the second system voltage, a second terminal coupled to a second current terminal of the current terminal pair of the first differential transistor pair, and a control terminal coupled to a control terminal of the first N-type transistor;
- a third N-type transistor, having a first terminal coupled to the second terminal of the first N-type transistor, a second terminal coupled to the control terminal of the first N-type transistor, and a control terminal coupled to a fourth bias voltage;
- a fourth N-type transistor, having a first terminal coupled to the second terminal of the second N-type transistor, and a control terminal coupled to the fourth bias voltage;
- a fifth N-type transistor, having a first terminal coupled to the second terminal of the third N-type transistor and a second terminal of the fifth P-type transistor, a second terminal coupled to the first terminal of the fifth P-type transistor, and a control terminal coupled to a fifth bias voltage;
- a sixth N-type transistor, having a first terminal coupled to a second terminal of the fourth N-type transistor and a second terminal of the sixth P-type transistor, a second terminal coupled to the first terminal of the sixth P-type transistor, and a control terminal coupled to a sixth bias voltage; and
- a seventh N-type transistor, having a first terminal coupled to the second system voltage, a second terminal coupled to a second terminal of the seventh P-type transistor for commonly outputting the analog voltage, and a control terminal coupled to the second terminal of the fourth N-type transistor.

3. The current-mode interpolation buffer as claimed in claim 1, wherein the current source comprises:
- a plurality of first unit current sources, each providing a unit amperage;
- a first switch unit, selectively coupling a part of or all of the first unit current sources to the reference terminal of the first differential transistor pair according to the at least one bit of the digital code, so as to output the first current, or coupling none of the first unit current sources to the first differential transistor pair;
- a plurality of second unit current sources, each providing a unit amperage; and
- a second switch unit, selectively coupling a part of or all of the second unit current sources to the reference terminal of the second differential transistor pair according to the at least one bit of the digital code, so as to draw the second current, or coupling none of the second unit current sources to the second differential transistor pair.

4. The current-mode interpolation buffer as claimed in claim 1, wherein the current source draws a third current and outputs a fourth current according to the at least one bit of the digital code, and the current-mode interpolation buffer further comprises:
- a third differential transistor pair, having a first control terminal and a second control terminal respectively receiving the first rough voltage and the analog voltage, a reference terminal coupled to the current source for draining the third current, and a current terminal pair coupled to the second input terminal pair of the output stage; and
- a fourth differential transistor pair, having a first control terminal and a second control terminal respectively receiving the second rough voltage and the analog voltage, a reference terminal coupled to the current source for receiving the fourth current, and a current terminal pair coupled to the first input terminal pair of the output stage.

5. The current-mode interpolation buffer as claimed in claim 4, wherein the current source comprises:
- a current providing circuit, providing a plurality of reference currents;
- a switch circuit, selectively coupling a part of or all of the reference currents to a first output terminal of the switch circuit according to the at least one bit of the digital code, and coupling the other part of the reference currents to a second output terminal of the switch circuit; and
- a current collecting circuit, coupled to the first output terminal and the second output terminal of the switch circuit, outputting the fourth current and drawing the second current according to a current of the first output terminal of the switch circuit, and drawing the third current and outputting the first current according to a current of the second output terminal of the switch circuit.

6. The current-mode interpolation buffer as claimed in claim 5, wherein the current providing circuit comprises:
- a first current source circuit, having an output terminal providing a first reference current;
- a second current source circuit, having an output terminal providing a second reference current, wherein the second reference current is twice of the first reference current; and
- a third current source circuit, having an output terminal providing a third reference current, wherein the third reference current is equal to the first reference current.

7. The current-mode interpolation buffer as claimed in claim 6, wherein the switch circuit comprises:
- a wire, having two ends respectively coupled to the output terminal of the first current source circuit and the first output terminal of the switch circuit;
- a first transistor, having a first terminal coupled to the output terminal of the second current source circuit, and a control terminal receiving a first bit of the digital code;
- a second transistor, having a first terminal coupled to a second terminal of the first transistor, a second terminal coupled to the first output terminal of the switch circuit, and a control terminal receiving a system voltage;
- a third transistor, having a first terminal coupled to the output terminal of the second current source circuit, and a control terminal receiving an inverting signal of the first bit of the digital code;
- a fourth transistor, having a first terminal coupled to a second terminal of the third transistor, a second terminal coupled to the second output terminal of the switch circuit, and a control terminal receiving the system voltage;
- a fifth transistor, having a first terminal coupled to the output terminal of the third current source circuit, and a control terminal receiving a second bit of the digital code;
- a sixth transistor, having a first terminal coupled to a second terminal of the fifth transistor, a second terminal coupled to the first output terminal of the switch circuit, and a control terminal receiving the system voltage;
- a seventh transistor, having a first terminal coupled to the output terminal of the third current source circuit, and a control terminal receiving an inverting signal of the second bit of the digital code; and
- an eighth transistor, having a first terminal coupled to a second terminal of the seventh transistor, a second terminal coupled to the second output terminal of the switch circuit, and a control terminal receiving the system voltage.

8. The current-mode interpolation buffer as claimed in claim 5, wherein the current collecting circuit comprises:
- a first transistor, having a first terminal coupled to the first output terminal of the switch circuit, a second terminal coupled to a first system voltage, and a control terminal coupled to the first terminal of the first transistor;
- a second transistor, having a first terminal coupled to the reference terminal of the second differential transistor pair for drawing the second current, a second terminal coupled to the first system voltage, and a control terminal coupled to the control terminal of the first transistor;
- a third transistor, having a first terminal coupled to the first system voltage, and a control terminal coupled to the control terminal of the first transistor;
- a fourth transistor, having a first terminal coupled to a second system voltage, a second terminal coupled to a second terminal of the third transistor, and a control terminal coupled to the second terminal of the fourth transistor;
- a fifth transistor, having a first terminal coupled to the second system voltage, a second terminal coupled the reference terminal of the fourth differential transistor pair for outputting the fourth current, and a control terminal coupled to the control terminal of the fourth transistor;
- a sixth transistor, having a first terminal coupled to the second output terminal of the switch circuit, a second terminal coupled to the first system voltage, and a control terminal coupled to the first terminal of the sixth transistor;
- a seventh transistor, having a first terminal coupled to the reference terminal of the third differential transistor pair for drawing the third current, a second terminal coupled to the first system voltage, and a control terminal coupled to the control terminal of the sixth transistor;
- an eighth transistor, having a first terminal coupled to the first system voltage, and a control terminal coupled to the control terminal of the sixth transistor;
- a ninth transistor, having a first terminal coupled to the second system voltage, a second terminal coupled to a second terminal of the eighth transistor, and a control terminal coupled to the second terminal of the ninth transistor; and
- a tenth transistor, having a first terminal coupled to the second system voltage, a second terminal coupled to the reference terminal of the first differential transistor pair for outputting the first current, and a control terminal coupled to the control terminal of the ninth transistor.

9. The current-mode interpolation buffer as claimed in claim 1, further comprising:
- a logic unit, coupled to the first differential transistor pair and the second differential transistor pair, and comparing a third rough voltage, a fourth rough voltage, a first reference voltage and a second reference voltage, wherein when the third rough voltage and the fourth rough voltage belong to a range from the first reference voltage to the second reference voltage, the logic unit outputs the third rough voltage to the first differential transistor pair to serve as the first rough voltage, and outputs the fourth rough voltage to the second differential transistor pair to serve as the second rough voltage; and when one of the third rough voltage and the fourth rough voltage does not belong to the range from the first reference voltage to the second reference voltage, the logic unit outputs one of the third rough voltage and the fourth rough voltage to the first differential transistor pair and the second differential transistor pair to serve as the first rough voltage and the second rough voltage.

10. The current-mode interpolation buffer as claimed in claim 9, wherein the logic unit comprises:
- a first comparator, having a first input terminal and a second input terminal respectively coupled to the first rough voltage and the first reference voltage;
- a second comparator, having a first input terminal and a second input terminal respectively coupled to the second rough voltage and the second reference voltage;
- an XOR gate, having a first input terminal and a second input terminal respectively coupled to an output terminal of the first comparator and an output terminal of the second comparator; and
- a selection unit, receiving an output of the first comparator, an output of the XOR gate, the third rough voltage and the fourth rough voltage, and selectively performing one of following steps according to the outputs of the first comparator and the XOR gate:
    - outputting the third rough voltage to the first control terminal of the first differential transistor pair to serve as the first rough voltage, and outputting the third rough voltage to the first control terminal of the second differential transistor pair to serve as the second rough voltage;
    - outputting the fourth rough voltage to the first control terminal of the first differential transistor pair to serve as the first rough voltage, and outputting the fourth rough voltage to the first control terminal of the second differential transistor pair to serve as the second rough voltage; and outputting the third rough voltage to the first control terminal of the first differential transistor pair to serve as the first rough voltage, and outputting the fourth rough voltage to the first control terminal of the second differential transistor pair to serve as the second rough voltage.

11. A digital-to-analog conversion apparatus, for converting a digital code into an analog voltage, the digital-to-analog conversion apparatus comprising:

a digital-to-analog converter, receiving a first partial-bit of the digital code, and outputs a first rough voltage and a second rough voltage having corresponding levels according to the first partial-bit; and a current-mode interpolation buffer, coupled to the digital-to-analog converter, and the current-mode interpolation buffer comprising:

a current source, receiving a second partial-bit of the digital code, outputting a first current, and drawing a second current, wherein amperages of the first current and the second current are dependent on the second partial-bit of the digital code;

a first differential transistor pair, having a first control terminal and a second control terminal respectively receiving the first rough voltage and the analog voltage, a reference terminal coupled to the current source for receiving the first current, and a current terminal pair generating a first differential current;

a second differential transistor pair, having a first control terminal and a second control terminal respectively receiving the second rough voltage and the analog voltage, a reference terminal coupled to the current source for draining the second current, and a current terminal pair generating a second differential current; and an output stage, having a first input terminal pair and a second input terminal pair respectively coupled to the current terminal pair of the first differential transistor pair and the current terminal pair of the second differential transistor pair, and generating the analog voltage according to the first differential current and the second differential current, wherein the analog voltage belongs to a rough range from the first rough voltage to the second rough voltage.

12. The digital-to-analog conversion apparatus as claimed in claim 11, wherein the output stage comprises:

a first P-type transistor, having a first terminal coupled to a first system voltage, a second terminal coupled to a first current terminal of the current terminal pair of the second differential transistor pair;

a second P-type transistor, having a first terminal coupled to the first system voltage, a second terminal coupled to a second current terminal of the current terminal pair of the second differential transistor pair, and a control terminal coupled to a control terminal of the first P-type transistor;

a third P-type transistor, having a first terminal coupled to the second terminal of the first P-type transistor, a second terminal coupled to the control terminal of the first P-type transistor, and a control terminal coupled to a first bias voltage;

a fourth P-type transistor, having a first terminal coupled to the second terminal of the second P-type transistor, and a control terminal coupled to the first bias voltage;

a fifth P-type transistor, having a first terminal coupled to the second terminal of the third P-type transistor, and a control terminal coupled to a second bias voltage;

a sixth P-type transistor, having a first terminal coupled to a second terminal of the fourth P-type transistor, and a control terminal coupled to a third bias voltage;

a seventh P-type transistor, having a first terminal coupled to the first system voltage, and a control terminal coupled to the second terminal of the fourth P-type transistor;

a first N-type transistor, having a first terminal coupled to a second system voltage, a second terminal coupled to a first current terminal of the current terminal pair of the first differential transistor pair;

a second N-type transistor, having a first terminal coupled to the second system voltage, a second terminal coupled to a second current terminal of the current terminal pair of the first differential transistor pair, and a control terminal coupled to a control terminal of the first N-type transistor;

a third N-type transistor, having a first terminal coupled to the second terminal of the first N-type transistor, a second terminal coupled to the control terminal of the first N-type transistor, and a control terminal coupled to a fourth bias voltage;

a fourth N-type transistor, having a first terminal coupled to the second terminal of the second N-type transistor, and a control terminal coupled to the fourth bias voltage;

a fifth N-type transistor, having a first terminal coupled to the second terminal of the third N-type transistor and a second terminal of the fifth P-type transistor, a second terminal coupled to the first terminal of the fifth P-type transistor, and a control terminal coupled to a fifth bias voltage;

a sixth N-type transistor, having a first terminal coupled to a second terminal of the fourth N-type transistor and a second terminal of the sixth P-type transistor, a second terminal coupled to the first terminal of the sixth P-type transistor, and a control terminal coupled to a sixth bias voltage; and a seventh N-type transistor, having a first terminal coupled to the second system voltage, a second terminal coupled to a second terminal of the seventh P-type transistor for commonly outputting the analog voltage, and a control terminal coupled to the second terminal of the fourth N-type transistor.

13. The digital-to-analog conversion apparatus as claimed in claim 11, wherein the current source comprises:

a plurality of first unit current sources, each providing a unit amperage;

a first switch unit, selectively coupling a part of or all of the first unit current sources to the reference terminal of the first differential transistor pair according to the second partial-bit of the digital code, so as to output the first current, or coupling none of the first unit current sources to the first differential transistor pair;

a plurality of second unit current sources, each providing a unit amperage; and a second switch unit, selectively coupling a part of or all of the second unit current sources to the reference terminal of the second differential transistor pair according to the second partial-bit of the digital code, so as to draw the second current, or coupling none of the second unit current sources to the second differential transistor pair.

14. The digital-to-analog conversion apparatus as claimed in claim 11, wherein the current source draws a third current and outputs a fourth current according to the second partial-bit of the digital code, and the current-mode interpolation buffer further comprises:

a third differential transistor pair, having a first control terminal and a second control terminal respectively receiving the first rough voltage and the analog voltage, a reference terminal coupled to the current source for draining the third current, and a current terminal pair coupled to the second input terminal pair of the output stage; and a fourth differential transistor pair, having a first control terminal and a second control terminal respectively receiving the second rough voltage and the analog voltage, a reference terminal coupled to the current source for receiving the fourth current, and a current terminal pair coupled to the first input terminal pair of the output stage.

15. The digital-to-analog conversion apparatus as claimed in claim 14, wherein the current source comprises:

a current providing circuit, providing a plurality of reference currents;

a switch circuit, selectively coupling a part of or all of the reference currents to a first output terminal of the switch circuit according to the second partial-bit of the digital code, and coupling the other part of the reference currents to a second output terminal of the switch circuit; and a current collecting circuit, coupled to the first output terminal and the second output terminal of the switch circuit, outputting the fourth current and drawing the second current according to a current of the first output terminal of the switch circuit, and drawing the third current and outputting the first current according to a current of the second output terminal.

16. The digital-to-analog conversion apparatus as claimed in claim 15, wherein the current providing circuit comprises:

a first current source circuit, having an output terminal providing a first reference current;

a second current source circuit, having an output terminal providing a second reference current, wherein the second reference current is twice of the first reference current; and a third current source circuit, having an output terminal providing a third reference current, wherein the third reference current is equal to the first reference current.

17. The digital-to-analog conversion apparatus as claimed in claim 16, wherein the switch circuit comprises:

a wire, having two ends respectively coupled to the output terminal of the first current source circuit and the first output terminal of the switch circuit;

a first transistor, having a first terminal coupled to the output terminal of the second current source circuit, and a control terminal receiving a first bit of the digital code;

a second transistor, having a first terminal coupled to a second terminal of the first transistor, a second terminal coupled to the first output terminal of the switch circuit, and a control terminal receiving a system voltage;

a third transistor, having a first terminal coupled to the output terminal of the second current source circuit, and a control terminal receiving an inverting signal of the first bit of the digital code;

a fourth transistor, having a first terminal coupled to a second terminal of the third transistor, a second terminal coupled to the second output terminal of the switch circuit, and a control terminal receiving the system voltage;

a fifth transistor, having a first terminal coupled to the output terminal of the third current source circuit, and a control terminal receiving a second bit of the digital code;

a sixth transistor, having a first terminal coupled to a second terminal of the fifth transistor, a second terminal coupled to the first output terminal of the switch circuit, and a control terminal receiving the system voltage;

a seventh transistor, having a first terminal coupled to the output terminal of the third current source circuit, and a control terminal receiving an inverting signal of the second bit of the digital code; and an eighth transistor, having a first terminal coupled to a second terminal of the seventh transistor, a second terminal coupled to the second output terminal of the switch circuit, and a control terminal receiving the system voltage.

18. The digital-to-analog conversion apparatus as claimed in claim 15, wherein the current collecting circuit comprises:

a first transistor, having a first terminal coupled to the first output terminal of the switch circuit, a second terminal coupled to a first system voltage, and a control terminal coupled to the first terminal of the first transistor;

a second transistor, having a first terminal coupled to the reference terminal of the second differential transistor pair for drawing the second current, a second terminal coupled to the first system voltage, and a control terminal coupled to the control terminal of the first transistor;

a third transistor, having a first terminal coupled to the first system voltage, and a control terminal coupled to the control terminal of the first transistor;

a fourth transistor, having a first terminal coupled to a second system voltage, a second terminal coupled to a second terminal of the third transistor, and a control terminal coupled to the second terminal of the fourth transistor;

a fifth transistor, having a first terminal coupled to the second system voltage, a second terminal coupled the reference terminal of the fourth differential transistor pair for outputting the fourth current, and a control terminal coupled to the control terminal of the fourth transistor;

a sixth transistor, having a first terminal coupled to the second output terminal of the switch circuit, a second terminal coupled to the first system voltage, and a control terminal coupled to the first terminal of the sixth transistor;

a seventh transistor, having a first terminal coupled to the reference terminal of the third differential transistor pair for drawing the third current, a second terminal coupled to the first system voltage, and a control terminal coupled to the control terminal of the sixth transistor;

an eighth transistor, having a first terminal coupled to the first system voltage, and a control terminal coupled to the control terminal of the sixth transistor;

a ninth transistor, having a first terminal coupled to the second system voltage, a second terminal coupled to a second terminal of the eighth transistor, and a control terminal coupled to the second terminal of the ninth transistor; and a tenth transistor, having a first terminal coupled to the second system voltage, a second terminal coupled to the reference terminal of the first differential transistor pair for outputting the first current, and a control terminal coupled to the control terminal of the ninth transistor.

* * * * *